(12) United States Patent
Drewes

(10) Patent No.: US 7,470,552 B2
(45) Date of Patent: Dec. 30, 2008

(54) METHOD FOR PRODUCTION OF MRAM ELEMENTS

(75) Inventor: Joel A. Drewes, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/700,958

(22) Filed: Feb. 1, 2007

(65) Prior Publication Data

US 2007/0196933 A1 Aug. 23, 2007

Related U.S. Application Data

(63) Continuation of application No. 10/610,823, filed on Jul. 2, 2003, now Pat. No. 7,189,583.

(51) Int. Cl.
 *H01L 21/00* (2006.01)
(52) U.S. Cl. .............. 438/3; 257/295; 257/E21.655
(58) Field of Classification Search .............. 438/3; 257/295, E21.665
See application file for complete search history.

(56) References Cited

U.S. PATENT DOCUMENTS

| | | | |
|---|---|---|---|
| 3,019,125 A | 1/1962 | Lloyd et al. | |
| 4,287,225 A | 9/1981 | Kneller et al. | |
| 4,455,626 A | 6/1984 | Lutes | |
| 4,604,176 A | 8/1986 | Paul | |
| 5,431,969 A | 7/1995 | Mallary | |
| 5,436,047 A | 7/1995 | Howard et al. | |
| 5,482,785 A | 1/1996 | Mahvan et al. | |
| 5,585,198 A | 12/1996 | Maeda et al. | |
| 5,640,343 A | 6/1997 | Gallagher et al. | |
| 5,680,091 A | 10/1997 | Maeda et al. | |
| 5,691,864 A | 11/1997 | Saito | |
| 5,700,593 A | 12/1997 | Okumura et al. | |
| 5,738,929 A | 4/1998 | Maeda et al. | |
| 5,989,674 A | 11/1999 | Marinero et al. | |
| 6,127,053 A | 10/2000 | Lin et al. | |
| 6,169,303 B1 * | 1/2001 | Anthony | 257/295 |
| 6,248,395 B1 | 6/2001 | Homola et al. | |
| 6,292,389 B1 | 9/2001 | Chen et al. | |
| 6,351,339 B1 | 2/2002 | Bar-Gadda | |
| 6,430,085 B1 | 8/2002 | Rizzo | |
| 6,511,761 B1 | 1/2003 | Tanahashi et al. | |
| 6,511,855 B2 | 1/2003 | Anthony | |

(Continued)

OTHER PUBLICATIONS

Bottom-Up Approach in SI Technology Based on Surface Structure Design, pp. 992-1001, Electrochemical Society Proceedings, vol. 2002-2, T. Ogino, et al., NTT Basic Research Laboratories.

(Continued)

*Primary Examiner*—Bradley K Smith
(74) *Attorney, Agent, or Firm*—Dickstein Shapiro LLP

(57) ABSTRACT

Magneto-resistive random access memory elements include a ferromagnetic layer having uniaxial anisotropy provided by elongate structures formed in the ferromagnetic film. The magnetic dipole aligns with the long axis of each structure. The structures can be formed in a variety of ways. For example, the ferromagnetic film can be applied to a seed layer having a textured surface. Alternatively, the ferromagnetic film can be stressed to generate the textured structure. Chemical mechanical polishing also can be used to generated the structures.

22 Claims, 3 Drawing Sheets

U.S. PATENT DOCUMENTS

| | | | |
|---|---|---|---|
| 6,625,058 B2 * | 9/2003 | Iwasaki | 365/171 |
| 6,649,423 B2 | 11/2003 | Anthony et al. | |
| 6,661,703 B1 * | 12/2003 | Ikeda | 365/158 |
| 6,667,118 B1 | 12/2003 | Chang et al. | |
| 6,740,397 B1 | 5/2004 | Lee | |
| 6,833,573 B1 | 12/2004 | Worledge | |
| 2002/0127436 A1 | 9/2002 | Shibamoto et al. | |
| 2004/0115481 A1 | 6/2004 | Pelhos et al. | |
| 2004/0161577 A1 | 8/2004 | Umezawa et al. | |

OTHER PUBLICATIONS

R. Glang et al., "Handbook of Thin Film Technology," McGraw-Hill, 1970, pp. 17-40, 17-41.

Park et al., "Growth-induced Uniaxial In-Plane Magnetic Anisotropy for Ultrathin Fe Deposited on MgO(001) by Oblique-Incidence Molecular Beam Epitaxy," Appl. Phys. Lett., 66 (Apr. 1995) 2140.

McMichael et al., Strong anisotropy in Thin Magnetic Films Deposited on Obliquely Sputtered Ta Underlayers, J. Appl. Phys., 88, (Nov. 2000), 5296.

Sekiba et al., "Uniaxial Magnetic Anisotropy Tuned by Nanoscale Ripple Formation: Ion-Sculpting of Co/Cu (001) Thin Films," Appl. Phys. Lett., 84 (Feb. 2004) 762.

De Wit et al., "Induced Anisotropy of Amorphous CoFeSiB and CoNbZr Magnetic Materials," IEEE Trans., Magnetics, 23, (Sep. 1987), 2123.

Cho et al., "Effect of Seed Layer on the Magnetoresistance Characteristics in a-CoNbZr-Based Spin Valves," IEEE Trans. Magnetics, 34, (Jul. 1998), 1414.

Tegan et al., "Effect of Néel Coupling on Magnetic Tunnel Junctions," J. Appl. Phys., 89, (Jun. 2001), 8169.

Pietambaram et al., "Exchange Coupling Control and Thermal Endurance of Synthetic Antiferromagnet Structures for MRAM," IEEE Trans. Magnetics, 40 (Jul. 2004), 2619.

Merriam-Webster's Collegiate Dictionary Tenth Edition, 1998, p. 45.

* cited by examiner

METHOD FOR PRODUCTION OF MRAM ELEMENTS

CROSS REFERENCE TO RELATED APPLICATIONS

The present application is a continuation of U.S. application Ser. No. 10/610,823, filed on Jul. 2, 2003, now U.S. Pat. No. 7,189,583 the disclosure of which is herewith incorporated by reference in its entirety.

BACKGROUND OF THE INVENTION

1. Field of the Invention

The invention relates to methods of producing magnetoresistive elements, and more particularly, to methods of producing magnetoresistive elements having an induced secondary anisotropy.

2. Description of the Related Art

Storage memories of various types are used extensively in digital systems such as microprocessor-based systems, digital processing systems, and the like. Recently, magnetic random access memory (MRAM) devices have been investigated for possible use in non-volatile random access memory. Information is stored in MRAM devices based on a magnetoresistive effect, in which memory cells formed of ferromagnetic layers in the device have resistances that change based on the magnetized state of a free ferromagnetic layer compared to that of a pinned (fixed) ferromagnetic layer. The magnetic moment of the pinned layer remains fixed while the magnetic moment of the free layer can change depending on an externally-applied magnetic field or potential. The relative magnetic directions of the free layer to the pinned layer typically are referred to as "parallel" and "antiparallel."

A magnetic memory element, such as a magnetic tunnel junction (MTJ), is formed on a wafer substrate. The structure includes free and pinned ferromagnetic layers separated by a non-magnetic tunnel junction barrier. The magnetic memory elements are formed using thin-film materials and can be manufactured on the sub-micron level.

In response to parallel and antiparallel magnetic states, the magnetic memory element represents two different resistances to a current provided across the memory element in a direction perpendicular to the plane of the ferromagnetic layers. The tunnel barrier is sufficiently thin that quantum-mechanical tunneling of charge carriers occurs across the barrier junction between the two separated sets of ferromagnetic layers. The resistance across the element has minimum and maximum values corresponding to whether the magnetization vectors of the free and pinned layers are parallel or antiparallel.

Consequently, it is necessary when producing magnetic memory elements to provide layers having magnetic moments that are selectively aligned. Magnetic memory element structures include very thin layers, also known as ultrathin films, some of which are tens of angstroms or less in thickness. The structure of ultrathin films has a strong influence on their magnetic properties. Small variations in thickness and surface morphology can impact the magnetic characteristics of an ultrathin magnetic film layer.

Magnetic anisotropy, the tendency of the magnetic moments in the layer to align in a given direction, can be influenced by the shape of the layer. Magnetic moments tend to align head to tail, rather than head to head, so by forming a layer as a rectangle, for example, the magnetic moments will tend to align parallel to the longer dimension of the layer. This phenomenon is known as shape-induced anisotropy. It would be advantageous to be able to induce anisotropy without regard to the overall shape of the film layer.

It is known in the prior art to form layer shapes using photolithography. Photolithography is susceptible, however, to image distortion and instabilities, problems that are exacerbated at the sub-micron level at which magnetic memory elements are being manufactured. It would be advantageous to be able to induce magnetic anisotropy in layers of a magnetic memory element by methods other than photolithography, which methods are accurate and reproducible at the sub-micron level of production.

BRIEF SUMMARY OF THE INVENTION

The present invention overcomes the problems in the prior art by providing induced uniaxial anisotropy rather than shape anisotropy to generate preferential alignment in sub-micron MRAM elements.

According to a preferred embodiment, the invention relies on preferential patterning or roughening of the starting substrate surface, which patterning translates to magnetic alignment within the MRAM structure itself. The magnetic moments of ferromagnetic films produced according to the present invention will align preferentially along grooves or patterns generated in the starting surface. By generating very fine surface patterns, anisotropy is induced independent of the overall shape of the element, even if the element is circular or symmetric. This method allows control of the anisotropy or switching field to be generated by processes which are more reliable than photoimaging.

Various methods can be used to create the anisotropy-inducing features. Grooves or patterns can be generated in a seed layer or a magnetic layer by masking the surface and etching. According to another embodiment, the patterns also can be generated by stressing the films on the surface and allowing them to relax and form ripples in a deposited film. Additionally, chemical mechanical polishing (CMP) can be used to generate surface texture. Other techniques include nano-fabrication methods such as self-assembly, self-organization, and nano-patterning.

Texturing an underlayer (seed layer) currently is preferred as the easiest and most repeatable method for inducing a secondary anisotropy in a magnetic film. This can be accomplished by utilizing off axis angular deposition which creates ripples by generating shadow effects as the film grows. The geometry and roughness that induce the anisotropy are controlled by deposition angle and thickness, which are very easy to repeat in a deposition system.

DETAILED DESCRIPTION OF THE INVENTION

Figure 1:
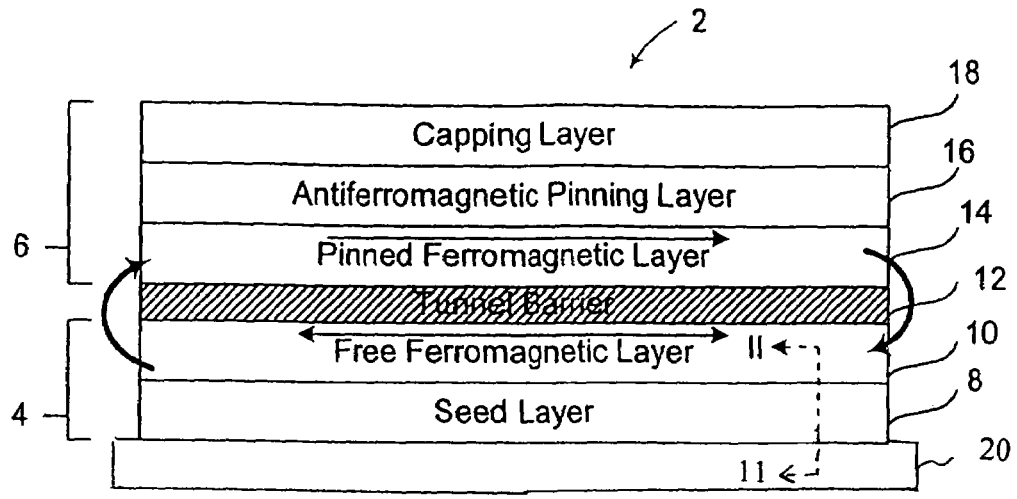
FIG. 1 illustrates a magnetic tunnel junction structure according to an exemplary embodiment of the present invention.

A generalized, exemplary magneto-resistive element structure 2 is shown in FIG. 1. The structure includes a free stack 4 and a pinned stack 6 formed above a substrate 20. Free stack 4 includes a seed layer 8 on which is disposed a free ferromagnetic layer 10. Above free stack 4 is pinned stack 6, separated by a tunnel barrier layer 12. Pinned stack 6 is made up of a pinned ferromagnetic layer 14, an antiferromagnetic pinning layer 16, and a capping layer 18. Other arrangements can be used. For example, the free and pinned ferromagnetic layers 10 and 14 may each be formed as a plurality of stacked individual layers. The stacks also can include offset control and coupling layers.

Figure 2:
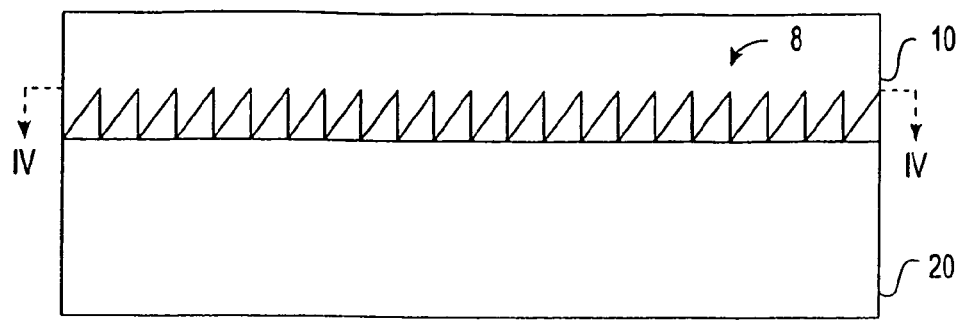
FIG. 2 is a cross-sectional illustration taken along the line II-II in FIG. 1 of a portion of the film stack shown in which secondary anisotropy is imparted to a ferromagnetic layer according to an exemplary embodiment of the present invention.
Figure 4:
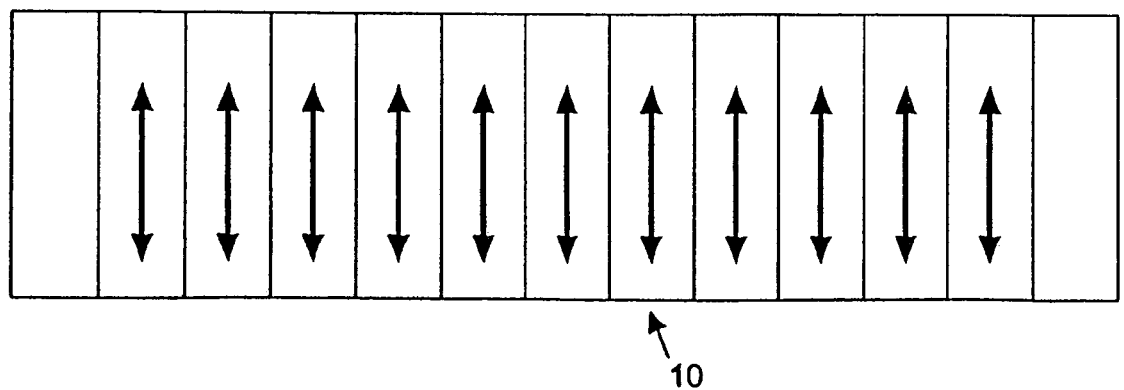
FIG. 4 is a plan view of the planes IV-IV in FIGS. 2 and 3 schematically illustrating secondary anisotropy imparted to a ferromagnetic layer in the film stack.

FIG. 2 shows a partial cross-section of film stack 2 taken along the line II-II in FIG. 1. As illustrated in FIG. 2, seed layer 8 provided above substrate 20 is textured. The texture of the seed layer 8 imparts uniaxial anisotropy in ferromagnetic film 10 grown above seed layer 8. Alignment of the magnetic moments in ferromagnetic film 10 is illustrated in FIG. 4, described further below.

The seed layer 8 can be textured by various methods known in the art, including patterning and etching, off-axis deposition, in which thin films are deposited at an angle not perpendicular to the substrate, dimple etching, or by chemical mechanical polishing (CMP), for example. In a representative CMP process, an oxide slurry having a neutral pH is applied with pressure to a substrate. The presence of oxide in the slurry and the physical pressure lead to micro-scratches in the surface. Polishing is carried out so that the micro-scratches are aligned to impart the unixial anisotropy to the deposited ferromagnetic film layer 10.

In addition, various nanofabrication techniques can be utilized to impart texture to seed layer 8. In general, nanofabrication techniques include lithographic techniques using ultraviolet light, X-rays, ion beams, and electron beams; scanning probe techniques for nano-patterning, (scanning tunneling microscopy (STM) and atomic force microscopy (AFM); and self-assembly or self-organization of nanostructures. Examples of the latter include quantum dots and quantum wires. See T. Ogino et al., "Bottom-up approach in Si technology based on surface structure design," Electrochemical Society Proceedings, Vol. 2002-2, p. 992-1001, the entire disclosure of which is incorporated herein by reference.

The textured seed layer may be a dielectric, metal, or other thin film that would impart controlled morphology to the ferromagnetic film. Typically, the surface texture features are tens of microns in length, and a few nanometers to a few tenths of nanometers in width and depth.

Figure 3:
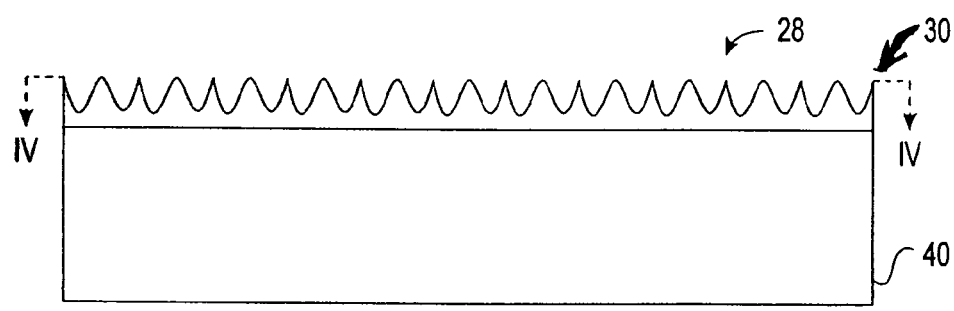
FIG. 3 illustrates an exemplary embodiment of the present invention in which aligning structures are formed directly in a ferromagnetic film supported on a substrate.

According to an alternative method of the invention, aligning structures 28 are formed more directly in a ferromagnetic film 30, shown supported on a substrate 40 in FIG. 3. The aligning structures are formed by stressing film 30, applying tensile or compressive force, for example. Alternatively, aligning structures can be formed in the ferromagnetic film by applying techniques discussed above in connection with forming aligning structures in the seed layer directly to the ferromagnetic film layer.

FIG. 4 depicts the magnetic dipole alignment in ferromagnetic film 10 along the trenches or long axis of any structures or textures formed in the ferromagnetic films 10 or 30.

Figure 5:
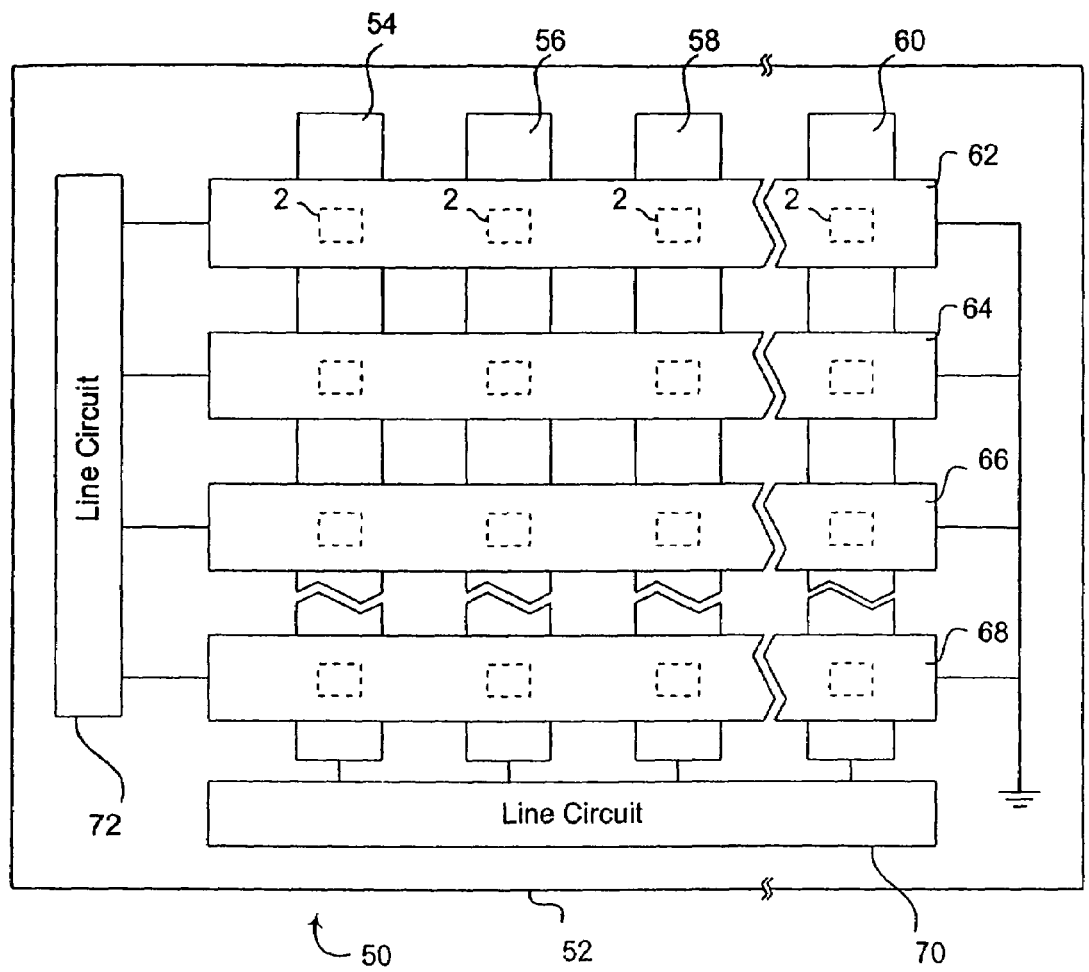
FIG. 5 illustrates an MRAM array according to an exemplary embodiment of the present invention.

FIG. 5 illustrates an MRAM including an array made up of magneto-resistive memory elements 2. MRAM array 50 is formed over a substrate 52 and includes column lines 54, 56, 58, and 60, and row lines 62, 64, 66, and 68. Columns and rows are selected by column and row line circuits 70 and 72, respectively. At the intersection of each column and row line is an MTJ memory element 2 fabricated in accordance with the invention.

Figure 6:
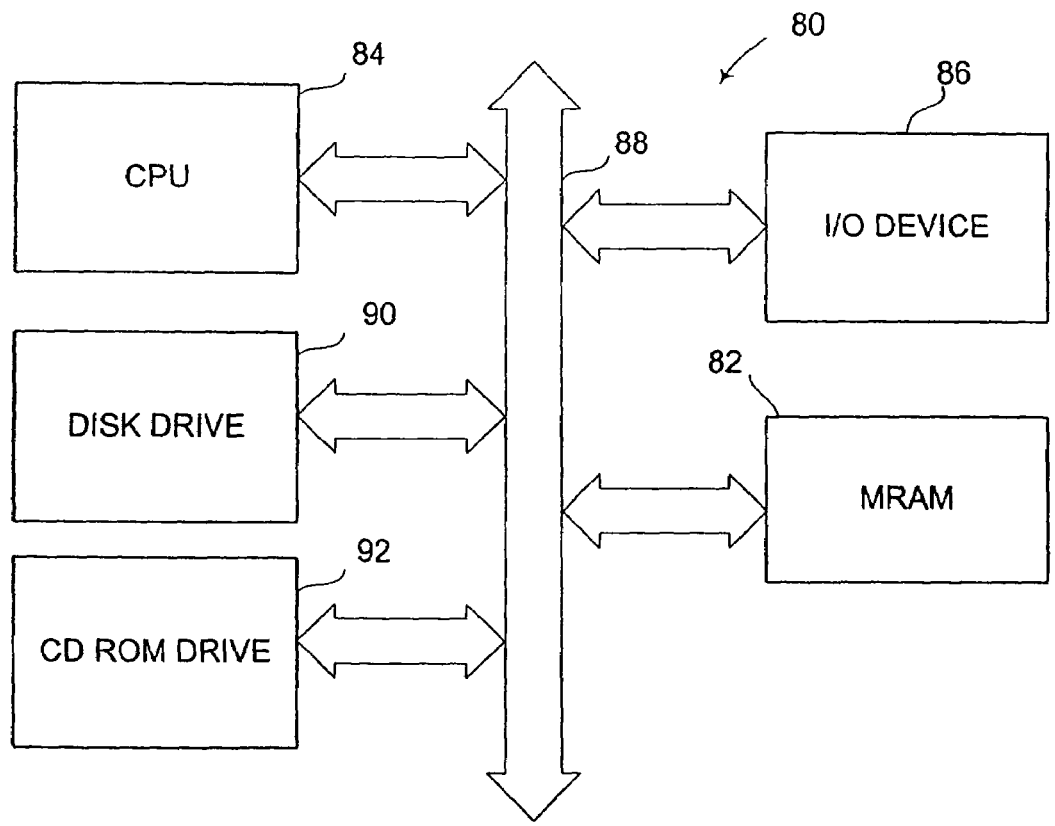
FIG. 6 illustrates a microprocessor-based system including an MRAM according to an exemplary embodiment of the present invention.

FIG. 6 illustrates a microprocessor-based system that includes an MRAM containing an MRAM array made up of magneto-resistive memory elements 2. FIG. 6 illustrates a processor system 80 in which an MRAM 82 according to the present invention may be utilized. System 80 includes a CPU 84 and a user input/output (I/O) device 86 connected to a system bus 88. System 80 also includes MRAM 82 which communicates with the CPU 84 over system bus 88. Other peripheral devices include a disk drive 90 and a CD ROM drive 92.

While preferred embodiments of the invention have been described and illustrated above, it should be understood that these are exemplary of the invention and are not to be considered as limiting. Additions, deletions, substitutions, and other modifications can be made without departing from the spirit or scope of the present invention. Accordingly, the invention is not to be considered as limited by the foregoing description but is only limited by the scope of the appended claims.

What is claimed as new and desired to be protected by Letter Patent of the United States is:

1. A method for producing a magnetic memory cell comprising:
    forming a seed layer above a substrate, the seed layer having at least one surface including a physical texture; and
    forming a ferromagnetic layer in contact with the formed seed layer to impart the physical texture from the at least one surface of the seed layer to the ferromagnetic layer and to provide the ferromagnetic layer with a uniaxial magnetic anisotropy aligned with and induced by the physical texture.

2. A method as in claim 1, wherein the physical texture includes a plurality of aligned ridges.

3. A method as in claim 2, wherein the aligned ridges are substantially mutually parallel.

4. A method as in claim 1, wherein the physical texture is imparted to the ferromagnetic layer by patterning and etching the seed layer.

5. A method as in claim 1, wherein the physical texture is imparted to the ferromagnetic layer by chemical mechanical polishing the seed layer.

6. A method as in claim 1, wherein the physical texture is imparted by depositing a thin film on a wafer surface at an oblique angle to the wafer surface.

7. A method as in claim 1, wherein the physical texture is imparted by applying a ferromagnetic film to a substrate, and stressing the ferromagnetic film.

8. A method as in claim 1, wherein the physical texture is formed on the seed layer by off-axis angular deposition of the seed layer.

9. A method as in claim 1, wherein the physical texture is formed on the seed layer by dimple etching the seed layer.

10. A method for producing a magnetic memory cell comprising:
    forming a seed layer above a substrate, the seed layer having at least one surface including a physical texture; and
    forming a ferromagnetic layer in contact with the formed seed layer to impart the physical texture from the at least one surface of the seed layer to the ferromagnetic layer and to provide the ferromagnetic layer within a uniaxial magnetic anisotropy aligned with and induced by the physical texture, wherein the physical texture is formed on the seed layer using a lithographic technique.

11. A method as in claim 10, wherein the lithographic technique comprises using an ultra violet light.

12. A method as in claim 10, wherein the lithographic technique comprises using ion beams.

13. A method as in claim 10, wherein the lithographic technique comprises using electron beams.

14. A method for forming a magnetic memory cell comprising:

forming a substrate;

forming a textured structure above the substrate;

forming a ferromagnetic film in contact with the textured structure to produce a texture to a surface of the ferromagnetic film caused by the texture of the textured structure and to generate in the ferromagnetic film uniaxial magnetic anisotropy aligned with and induced by the texture.

15. A method as in claim 14, wherein the texture is imparted to the ferromagnetic film by patterning and etching to form the textured structure.

16. A method as in claim 14, wherein the texture is imparted to the ferromagnetic film by chemical mechanical polishing to form the textured structure.

17. A method as in claim 14, wherein the texture is imparted to the ferromagnetic film by off-axis angular deposition to form the textured structure.

18. A method as in claim 14, wherein the texture is imparted to the ferromagnetic film by dimple etching to form the textured structure.

19. A method as in claim 14, wherein the texture is imparted to the ferromagnetic film using a lithographic technique to form the textured structure.

20. A method as in claim 19, wherein the lithographic technique comprises using an ultra violet light.

21. A method as in claim 19, wherein the lithographic technique comprises using ion beams.

22. A method as in claim 19, wherein the lithographic technique comprises using electron beams.

* * * * *